United States Patent [19]
Morooka et al.

[11] Patent Number: 6,025,713
[45] Date of Patent: Feb. 15, 2000

[54] SUPERCONDUCTING QUANTUM INTERFERENCE DEVICE AND NON-DESTRUCTIVE EVALUATION APPARATUS USING THE SAME

[75] Inventors: Toshimitsu Morooka; Satoshi Nakayama; Akikazu Odawara; Kazuo Chinone, all of Chiba, Japan

[73] Assignee: Seiko Instruments Inc., Japan

[21] Appl. No.: 09/050,791

[22] Filed: Mar. 30, 1998

[51] Int. Cl.[7] .................................................. G01R 33/035
[52] U.S. Cl. .............................. 324/248; 505/846; 257/31
[58] Field of Search ............................... 324/248; 257/31, 257/32, 33; 505/702, 703, 845, 846

[56] References Cited

U.S. PATENT DOCUMENTS 5,280,241  1/1994  Ueda et al. ............................. 324/248
5,804,835  9/1998  Kamikawa et al. ...................... 257/39

*Primary Examiner*—Jay Patidar
*Attorney, Agent, or Firm*—Adams & Wilks

[57] ABSTRACT

A detecting coil of a SQUID is made of a superconductive film material having a critical temperature higher than a critical temperature of a superconductive film material composing a Josephson junction part. It is possible to measure the sample even when its temperature is higher than the critical temperature of the Josephson junction section by increasing the critical temperature of the detecting coil than that of the Josephson junction section.

32 Claims, 8 Drawing Sheets

F I G. 4
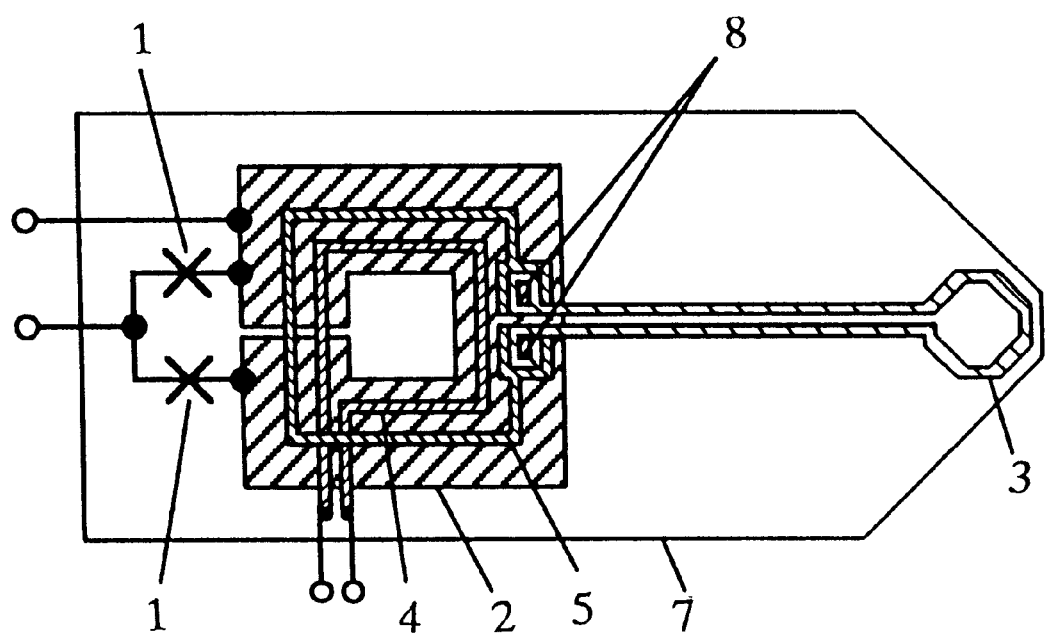

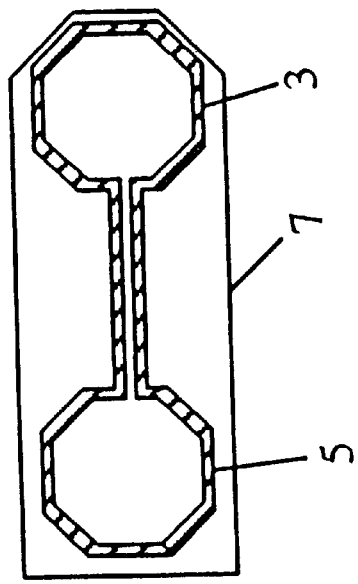
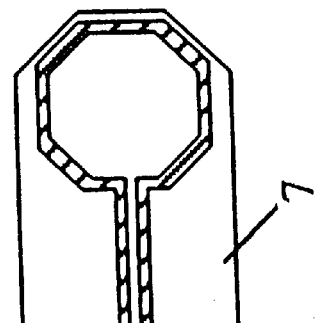
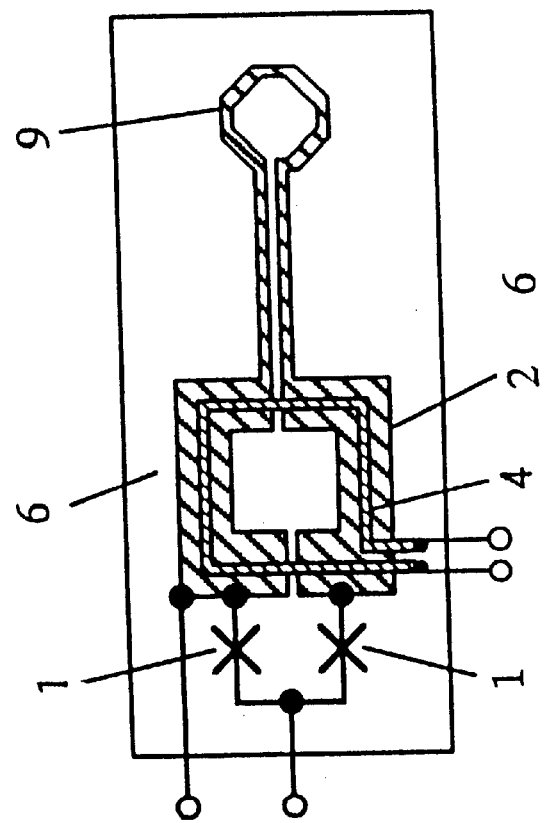
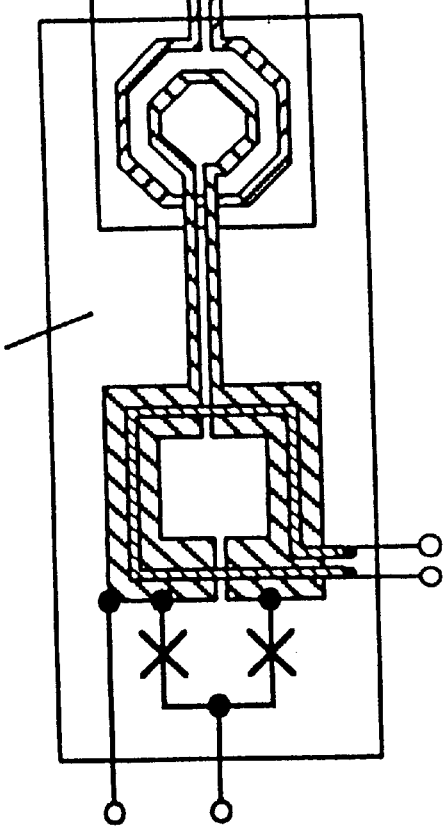
FIG. 8A    FIG. 8B    FIG. 8C

SUPERCONDUCTING QUANTUM INTERFERENCE DEVICE AND NON-DESTRUCTIVE EVALUATION APPARATUS USING THE SAME

BACKGROUND OF THE INVENTION

The present invention relates to a superconducting quantum interference device (hereinafter abbreviated as SQUID) for detecting a very small magnetic field, current, voltage, electromagnetic wave or the like, and more particularly, to a structure of a detecting coil of a SQUID flux meter having a high spatial resolution.

FIG. 9 is a structural drawing of a prior art SQUID. A superconducting ring comprising Josephson junctions 1, a washer coil 2 and a detecting coil 3 is formed on a substrate 6. In FIG. 9, the Josephson junction 1 is denoted simply by a symbol. A feedback-modulation coil 4 for FLL (Flux Locked Loop)-driving the SQUID is magnetically coupled to the washer coil 2. Magnetic flux detected by the detecting coil 3 is directly connected with the superconducting ring. This SQUID is an integrated SQUID in which all the components such as the Josephson junctions 1 and the detecting coil 3 are formed on the substrate 6 by a superconductive thin film. The superconductive thin film composing the SQUID is a Nb thin film, and a Nb/Al—AlOx/Nb tunnel junction is used for the Josephson junction.

FIG. 10 shows a scanning SQUID microscope constructed with the SQUID shown in FIG. 9. A sample 12 is attached to a sample holder 13. The SQUID 10 is mounted on a SQUID holder 14 and the surface of the sample 12 is scanned by an XYZ scanning controller 15. The SQUID 10, the sample 12, the sample holder 13 and the SQUID holder 14 are disposed in a vacuum chamber 17 within a cryostat 11. The vacuum chamber 17 is cooled by liquid helium 16, i.e. coolant.

The scanning SQUID microscope measures a distribution of magnetic field in an area on the order of micron geometry on the surface of the sample. It is necessary to miniaturize the detecting coil 3 in order to enhance the spatial resolution of the SQUID microscope. This, the SQUID 10 is realized so as to have a compact structure in which the detecting coil is integrated and formed by the superconductive thin film. It is also necessary to form the detecting coil 3 in close proximity to the sample 12.

It is also necessary to vary the temperature of the sample in the SQUID microscope. For instance, there is a case which the sample is measured by setting the temperature of the sample at a temperature higher than a critical temperature of the superconductor composing the SQUID. However, the temperature around the detecting coil 3 disposed in close proximity to the sample 12 exceeds the critical temperature of the detecting coil in the prior art SQUID. In such case, the detecting coil cannot maintain a superconducting state and cannot detect magnetic flux.

Thus, it is difficult to vary the temperature of the sample while enhancing the spatial resolution of the SQUID microscope.

Because the Josephson junction section and the detecting coil are made of the same superconductive thin film in the prior art SQUID, the critical temperature of the Josephson junction section is equal to the critical temperature of the detecting coil. When the SQUID microscope is constructed by using the above described SQUID and the sample is measured when the temperature of the sample is higher than the critical temperature of the SQUID, there is a case when the temperature around the detecting coil which is disposed in close proximity to the sample exceeds the critical temperature. Then, in such case the detecting coil is unable to maintain the superconducting state and to detect magnetic flux.

SUMMARY OF THE INVENTION

It is an object of the present invention to provide a SQUID used for constructing a SQUID microscope that can measure even when a sample temperature is higher than the critical temperature of the Josephson junction part by forming the detecting coil of a superconductive film material having a critical temperature higher than the critical temperature of the superconductive film material composing the Josephson junction in measuring a distribution of magnetic field of a sample.

It is another object of the present invention to provide a SQUID having an advantage in that the detecting coil suited to its use may be selected by allowing the detecting coil having various sizes and functions to be adopted and the detecting coil to be adopted in accordance to the sample temperature by forming the detecting coil on the substrate different from the Josephson junction part and then by pasting it with the main body part containing the Josephson junction to connect in the superconductive manner and to integrate the detecting coil.

It is another object of the present invention to provide a SQUID which is readily fabricated by providing the input coil magnetically coupled with the washer coil and by forming the whole superconducting loop comprising the detecting coil and the input coil by a superconductive film material having a critical temperature higher than the critical temperature of the superconductive film material forming the Josephson junction part, because the detecting coil needs not be connected with the input coil in the superconductive manner.

It is a further object of the present invention to provide a SQUID formed of a Nb superconductor and the detecting coil made of the high temperature superconductor, which are difficult to connect in the superconductive manner, that may be readily combined because the different superconductive materials may be formed on separate substrates and no superconductive connection is required by forming the superconducting loop comprising the input coil and the detecting coil on a substrate different from that on which the Josephson junctions are formed and then by pasting it with the substrate containing the Josephson junctions to magnetically couple the input coil with the superconducting ring.

BRIEF DESCRIPTION OF THE DRAWINGS

FIG. 4 is a structural drawing showing a SQUID according to a third embodiment of the present invention;

FIGS. 8A and 8B and 8C are structural drawings showing a SQUID according to a seventh embodiment of the present invention;

DETAILED DESCRIPTION OF THE PREFERRED EMBODIMENTS

In order to solve the aforementioned problem, according to the present invention, the detecting coil of the SQUID is made of a superconductive thin film material having a higher critical temperature than the critical temperature of the superconductive film material forming the Josephson junctions. Thus, when a SQUID microscope is constructed using the inventive SQUID comprising a detecting coil having a high critical temperature, measurements may be carried out by putting the detecting coil in close proximity to the sample even if the temperature of the sample is higher than the critical temperature of the Josephson junction section.

According to the present invention, a detecting coil of an a SQUID into which the detecting coil is integrated is made of a superconductive thin film material having a higher critical temperature than a critical temperature of a superconductive film material forming a Josephson junction of the squid and is formed on a substrate.

Embodiments of the accompanying present invention will be explained below with reference to the drawings.

Figure 1:
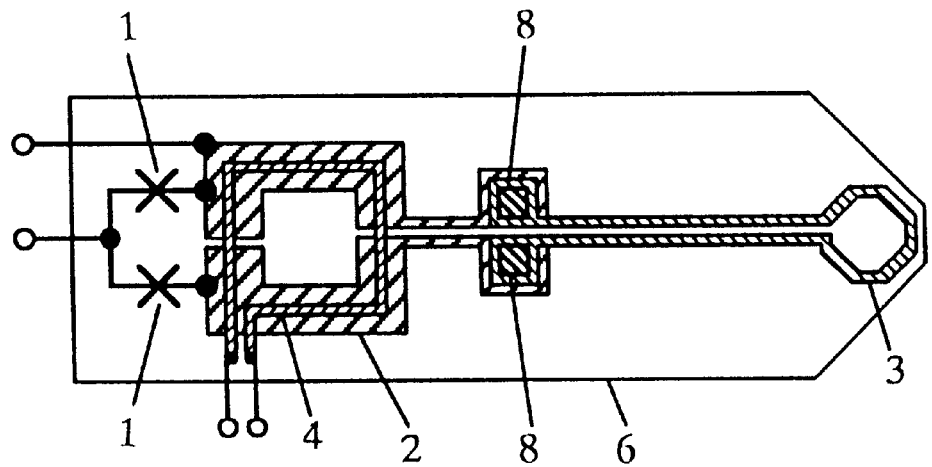
FIG. 1 is a structural drawing showing a SQUID according to a first embodiment of the present invention.

FIG. 1 is a structural drawing of the SQUID according to a first embodiment of the present invention. A superconducting ring comprising two Josephson junctions 1, a washer coil 2 and a detecting coil 3 is formed on a substrate 6 by a superconductive thin film. This structure is called a direct coupling system in which part of the superconducting ring is used as the detecting coil 3. The Josephson junction 1 is denoted simply by a symbol. A feedback-modulation coil 4 for FLL-driving the SQUID is magnetically coupled to the washer coil 2. The SQUID is miniaturized and is arranged so as to have a high spatial resolution by forming and integrating all the components of the SQUID by the superconductive thin film on the substrate 6. The detecting coil 3 is made of a superconductive film material having a higher critical temperature than the critical temperature of the superconductive film material forming the Josephson junctions and is connected with the washer coil 2 at superconducting connecting sections 8. For instance, when a tunnel junction of Nb/Al—AlOx/Nb is used for the Josephson junctions 1, a superconductive thin film having a high critical temperature such as NbN and YBCO, which are high temperature superconducting materials, is adopted for the detecting coil 3.

Figure 2:
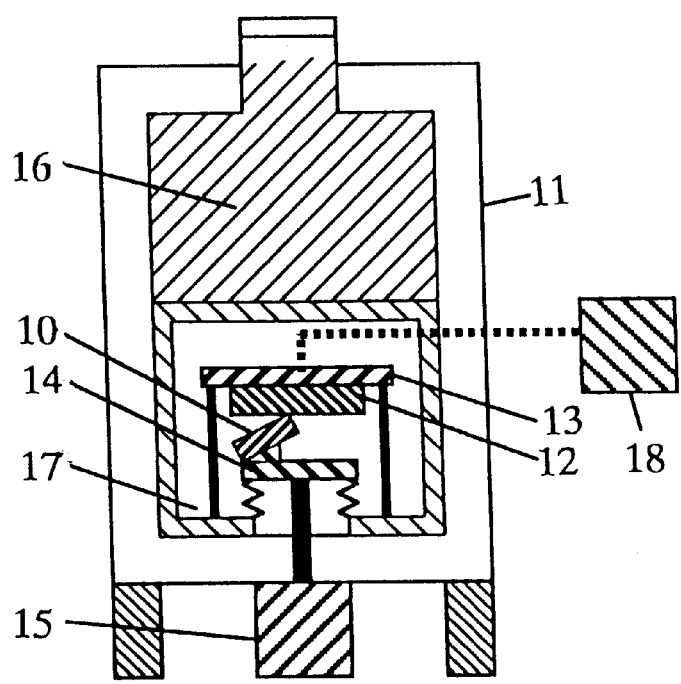
FIG. 2 is a structural drawing showing a scanning SQUID microscope using the SQUID of the present invention.

FIG. 2 is a structural drawing showing a scanning SQUID microscope constructed by using the SQUID of the present invention. A sample 12 is attached on a sample holder 13. The SQUID 10 is mounted on a SQUID holder 14 and the surface of the sample 12 is scanned by an XYZ scanning controller 15. The SQUID 10, the sample 12, the sample holder 13 and the SQUID holder 14 are disposed in a vacuum chamber 17 within a cryostat 11. The vacuum chamber 17 is cooled by liquid helium 16, i.e. coolant. The temperature of the sample 12 may be varied by a temperature controller 18. The SQUID 10 is set at an inclination angle so that a gradient of temperature can be obtained between the Josephson junction section and the detecting coil 3. The SQUID 10 is also set so that the detecting coil 3 is closer to the sample 12 than the Josephson junction section is far from that.

This arrangement allows magnetic flux to be measured in a state in which a gradient of temperature that the temperature of the Josephson junction section is lower than its critical temperature and the temperature of the sample is higher than the critical temperature of the Josephson junction section. Even if the sample is brought into close proximity with the detecting coil at this time, the whole SQUID may be kept in the superconducting state because the critical temperature of the detecting coil is high.

Although Nb has been described as the Josephson junction material in the present embodiment, any material may be used as long as it is a superconductive film material which can form the SQUID, such as NbN, Pb and YBCO, and the same effect as described above may be obtained by using a material having a critical temperature higher than that of the Josephson junction for the detecting coil. The coolant also may be any coolant, such as liquid nitrogen, as long as it can deal with the critical temperature of the Josephson junction. It is also possible to use a refrigerator.

Figure 3A:
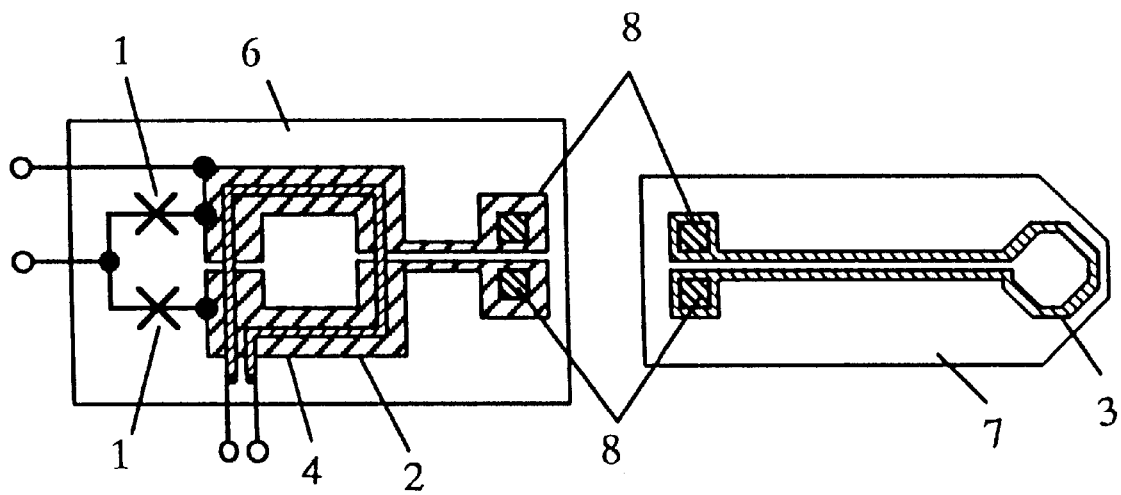
FIGS. 3A and 3B are structural drawings showing a SQUID according to a second embodiment of the present invention.
Figure 3B:
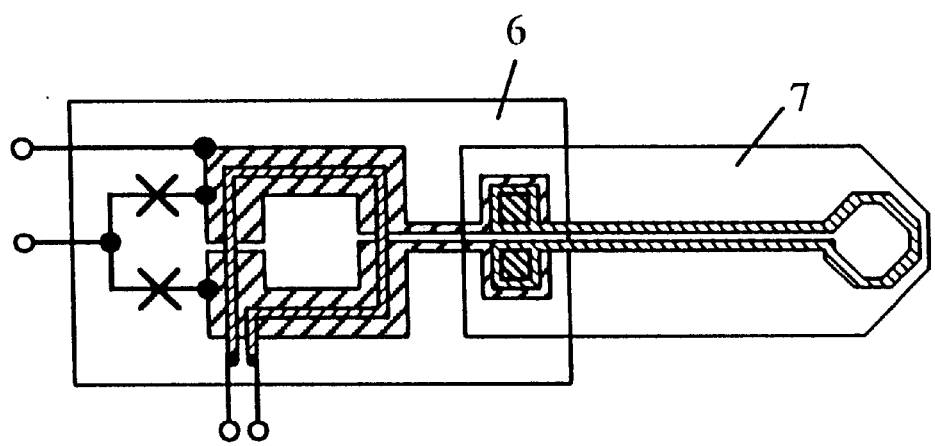

FIGS. 3A and 3B are structural drawings of a SQUID according to a second embodiment of the present invention. The two Josephson junctions 1 and the washer coil 2 are formed on the substrate 6 by the superconductive thin film. The feedback-modulation coil 4 for FLL-driving the SQUID is magnetically coupled to the washer coil 2. The detecting coil 3 is formed on a detecting coil substrate 7 which is different from the substrate 6 Josephson junctions 1 are formed. Further, the detecting coil 3 is made of a superconductive film material having a higher critical temperature than the critical temperature of the superconductive film material forming the Josephson junction part. A superconducting ring is made by connecting the detecting coil 3 with the washer coil 2 in a superconductive manner by pasting the substrate 6 with the detecting coil substrate 7 and by pressure-welding the superconducting sections 8 by using superconducting bumps or the like.

The SQUID of the present embodiment has an advantage in that it allows a detecting coil best suited for its use to be selected from detecting coils having various sizes and functions or a detecting coil to be adopted in correspondence with a temperature of a sample being measured.

Although the substrate 6 has been connected with the detecting coil substrate 7 by pressure-welding in the present embodiment, it is also possible to connect them by bonding by superconducting wires made of Pb—In—Au or the Like.

FIG. 4 is a structural drawing of a SQUID according to a third embodiment of the present invention. The superconducting ring comprising the two Josephson junctions 1 and the washer coil 2 is formed on the substrate 6 by a superconductive thin film. A feedback-modulation coil 4 and an input coil 5 for transmitting the magnetic flux detected by the detecting coil to the washer coil 2 are also formed and are magnetically coupled to the washer coil 2, respectively. The detecting coil 3 is formed of a superconductive film material having a higher critical temperature than the critical temperature of the superconductive film material forming the Josephson junction part and is connected with the input coil 5 at the superconducting connecting sections 8.

Figure 5A:
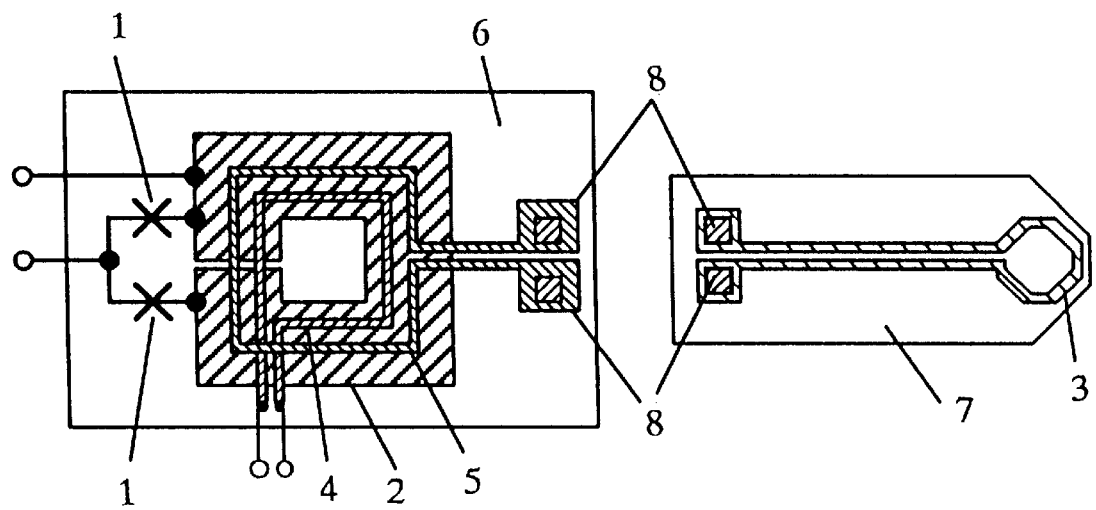
FIGS. 5A and 5B are structural drawings showing a SQUID according to a fourth embodiment of the present invention.
Figure 5B:
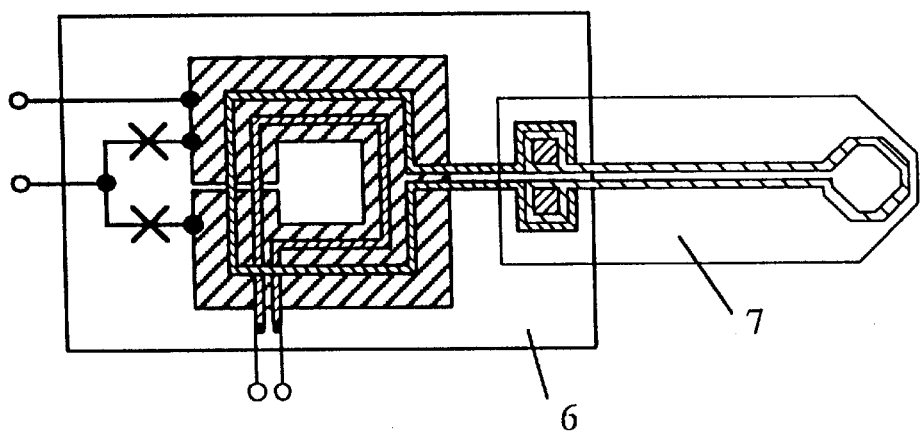

FIGS. 5A and 5B are structural drawings of a SQUID according to a fourth embodiment of the present invention. In the SQUID shown in the fourth embodiment, the detecting coil 3 is formed on the detecting coil substrate 7 which is different from the substrate on which the Josephson junctions are formed two and the substrates are pasted to connect with the input coil 5 in the superconductive manner. Similarly to the second embodiment, the present embodiment has a merit that it allows a detecting coil best suited for use to be selected.

Figure 6:
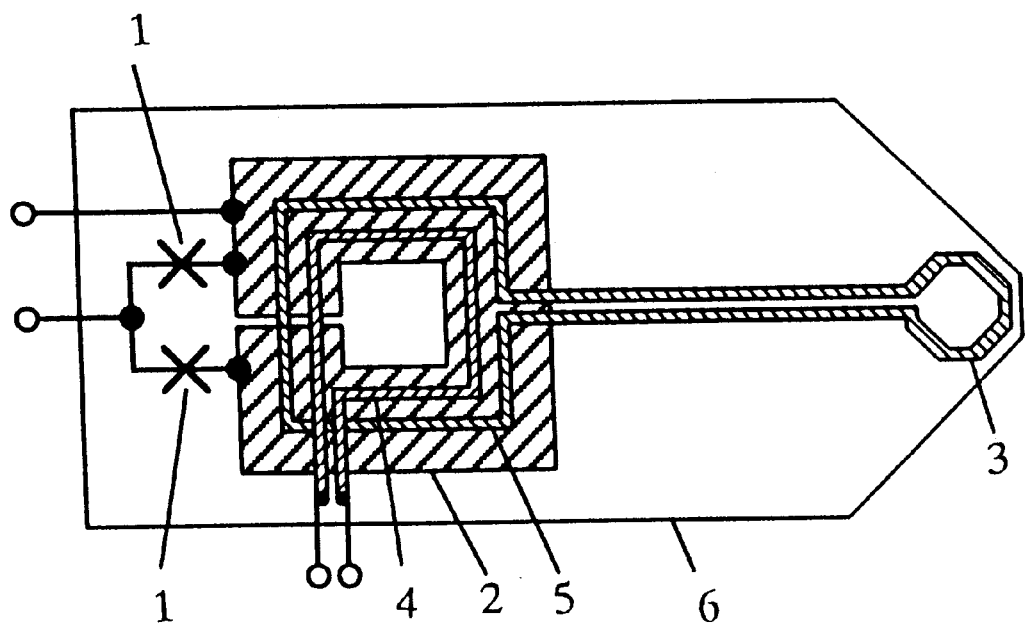
FIG. 6 is a structural drawing showing a SQUID according to a fifth embodiment of the present invention.

FIG. 6 is a structural drawing of a SQUID according to a fifth embodiment of the present invention. In the SQUID shown in the fifth embodiment, a whole superconducting loop comprising the detecting coil 3 and the input coil 5 is made of a superconductive film material having a critical temperature higher than the critical temperature of the superconductive film material forming the Josephson junction section. The present embodiment allows the SQUID to be readily fabricated because the detecting coil need not be separately connected with the input coil in a superconductive manner.

Figure 7A:
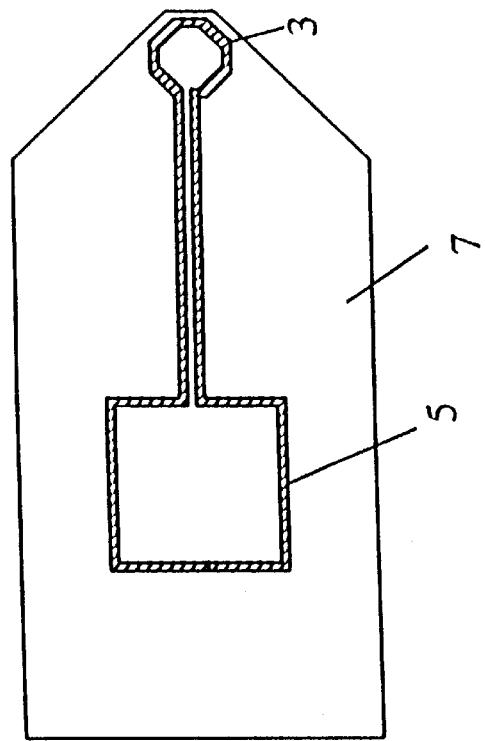
FIGS. 7A and 7B and 7C are structural drawings showing a SQUID according to a sixth embodiment of the present invention.
Figure 7B:
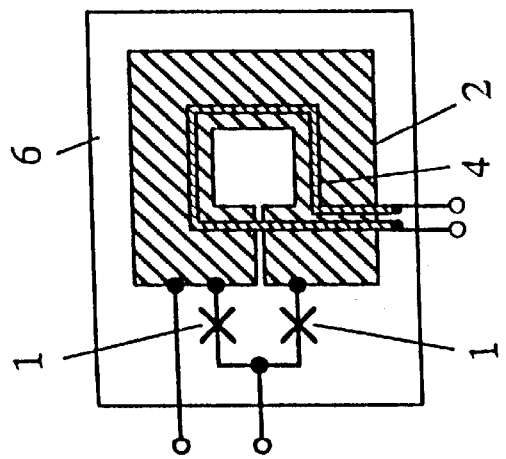
Figure 7C:
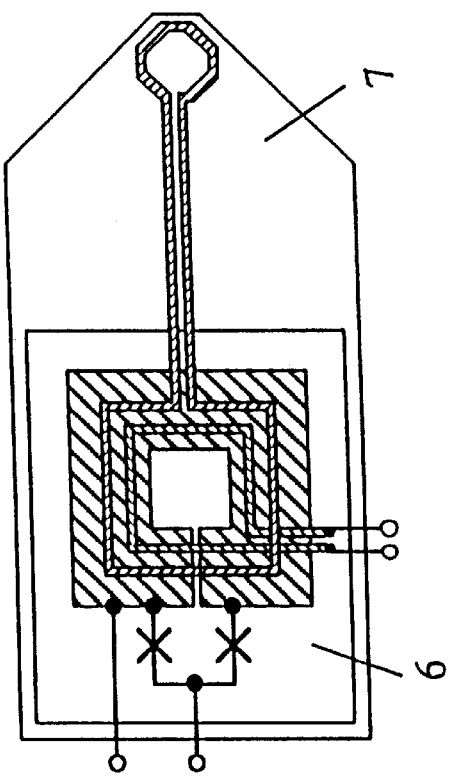
Figure 9:
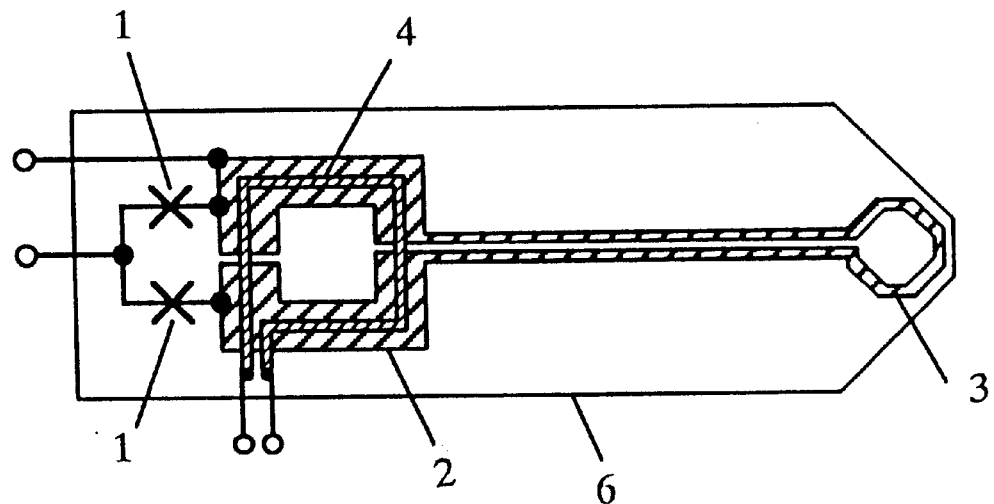
FIG. 9 is a structural drawing showing a prior art SQUID.
Figure 10:
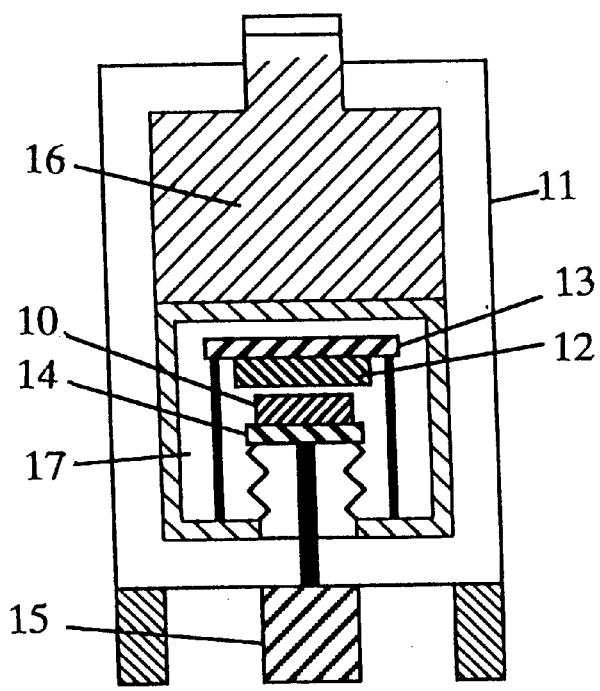
FIG. 10 is a structural drawing showing a scanning SQUID using the prior art SQUID.

FIGS. 7A and 7B and 7C are structural drawings of a SQUID according to a sixth embodiment of the present invention. The superconducting ring comprising two Josephson junctions 1 and the washer coil 2 is formed on the substrate 6 by the superconductive thin film. The feedback-modulation coil 4 is magnetically coupled to the washer coil 2. The superconducting loop comprising the detecting coil 3 and the input coil 5 is formed on the detecting coil substrate 7 which is different from the substrate on which the Josephson junctions 1 are formed by a superconductive film material having a critical temperature higher than the critical temperature of the superconductive film material forming the Josephson junctions. The substrate 6 is pasted with the detecting coil substrate 7 so that the input coil 7 is magnetically coupled with the washer coil 2. The present embodiment allows the different superconducting materials to be formed on the separate substrates and the SQUID made of the Nb superconductor and the detecting coil made of the high temperature superconductor, which are difficult to connected in the superconductive manner, to be readily combined because it requires no superconductive connection.

FIGS. 8A and 8B and 8C are structural drawings of a SQUID according to a seventh embodiment of the present invention. The substrate 6 an which the SQUID having the detecting coil 3 is formed and the detecting coil substrate 7 on which the superconducting loop comprising the detecting coil 3 and the input coil is formed are pasted. Magnetic flux detected by the detecting coil 3 on the detecting coil substrate 7 is transmitted from its input coil to the detecting coil 3 on the SQUID substrate 6 by magnetically connecting the detecting coil 3 on the substrate 6 with the input coil 5 on the detecting coil substrate 7. The shape of the detecting coil may be changed by using a plurality of detecting coil substrates like the present embodiment. It is also possible to deal with a case when there is a large difference between a sample temperature and the critical temperature of the Josephson junction by combining the detecting coil substrates having different critical temperatures.

It is also possible to arrange so as to detect magnetic field directly by the superconducting ring by forming part of the above-mentioned superconducting ring containing the Josephson junction by the superconductive film material having the critical temperature higher than the critical temperature of the Josephson junction part and by using that part as the detecting coil described above.

Further, it is possible to integrate the detecting coil by forming the detecting coil which is the part of the superconducting ring on the substrate which is different from the Josephson junction part and then by pasting it with the main body part containing the Josephson junction to connect in the superconductive manner.

Still more, it is possible to arrange so as to transmit the magnetic flux detected by the detecting coil to the superconducting ring via the input coil by providing the input coil magnetically coupled to the superconducting ring and by connecting the detecting coil with the input coil in the superconductive manner.

Then, it is also possible to form the whole superconducting loop comprising the input coil and the detecting coil by the superconductive film material having the critical temperature higher than that of the Josephson junction section.

Further, it is possible to magnetically couple the input coil with the superconducting ring by forming the superconducting loop comprising the input coil and the detecting coil on the substrate which is different from the Josephson junction part and then pasting it with the main part containing the Josephson junction.

What is claimed is:

1. A superconducting quantum interference device formed on a substrate by a superconductive thin film and having an integrated detecting coil, comprising:

a superconducting ring containing Josephson junctions formed of a superconductive film material;

a feedback-modulation coil magnetically coupled with the superconducting ring; and a detecting coil formed of a superconductive film material having a critical temperature higher than a critical temperature of the superconductive film material forming the Josephson junctions.

2. A superconducting quantum interference device as claimed in claim 1; wherein the detecting coil comprises a portion of the superconducting ring.

3. A superconducting quantum interference device as claimed in claim 2; wherein the Josephson junctions are formed on the substrate, and the detecting coil comprises a superconductive thin film formed on a different substrate from the substrate on which the Josephson junctions are formed, and wherein the substrates are pasted together.

4. A superconducting quantum interference device formed on a substrate by a superconductive thin film and having an integrated detecting coil, comprising:

a superconducting ring containing Josephson junctions formed of a superconductive film material on the substrate;

an input coil and a feedback-modulation coil magnetically coupled with the superconducting ring; and a detecting coil which forms a superconducting loop with the input coil and being formed of a superconductive film material having a critical temperature higher than a critical temperature of the superconductive film material forming the Josephson junctions.

5. A superconducting quantum interference device as claimed in claim 4; further comprising a second substrate, and wherein the detecting coil is formed of a superconductive thin film on the second substrate and the two substrates are connected by a superconductive material.

6. A superconducting quantum interference device as claimed in claim 4; wherein the detecting coil and the input coil comprise a superconducting loop and are formed of a superconductive film material having a critical temperature higher than the critical temperature of the superconductive film material forming the Josephson junctions.

7. A superconducting quantum interference device flux meter as claimed in claim 6; further comprising a second substrate, and wherein the detecting coil and the input coil are formed of a superconductive thin film on the second substrate, and the two substrates are connected by a superconductive material so that magnetic flux detected by the detecting coil is transmitted to the superconducting ring via the input coil.

8. A non-destructive evaluation apparatus having a superconductive quantum interference device for measuring a sample, a sample chamber in which the superconducting quantum interference device and the sample are disposed, and means for moving one of the superconducting quantum interference device and the sample to cause relative movement therebetween; wherein the superconducting quantum interference device comprises a superconducting quantum interference device according to any one of claims 1 through 7.

9. A non-destructive evaluation apparatus comprises a scanning superconducting quantum interference device microscope.

10. A superconducting quantum interference device comprising: a substrate; a superconducting ring containing Josephson junctions formed of a superconductive film material on the substrate; and a detecting coil formed of a superconductive material having a critical temperature higher than that of the superconductive material forming the Josephson junctions.

11. A superconducting quantum interference device according to claim 10; further comprising a feedback-modulation coil magnetically coupled with the superconducting ring.

12. A superconducting quantum interference device according to claim 10; further comprising a washer coil coupled with the Josephson junctions.

13. A superconducting quantum interference device according to claim 10; further comprising an input coil coupled with the superconducting ring.

14. A superconducting quantum interference device according to claim 13; wherein the input coil is coupled with the detecting coil.

15. A superconducting quantum interference device according to claim 10; wherein the detecting coil comprises a portion of the superconducting ring.

16. A superconducting quantum interference device according to claim 10; further comprising superconducting connecting sections formed of a superconductive material for connecting the detecting coil and the superconducting ring.

17. A superconducting quantum interference device according to claim 10; further comprising a second substrate, and wherein the detecting coil is formed on the second substrate and the two substrates are pasted together by a superconductive material.

18. A superconducting quantum interference device according to claim 17; wherein the input coil is formed on the second substrate.

19. A superconducting quantum interference device comprising: a substrate; a superconducting ring containing Josephson junctions formed of a superconductive material on the substrate; an input coil magnetically coupled with the superconducting ring; and a detecting coil which forms a superconducting loop with the input coil and has a critical temperature higher than that of the superconductive material forming the Josephson junctions.

20. A superconducting quantum interference device according to claim 19; wherein the Josephson junctions, the input coil and the detecting coil are formed of a thin film superconductive material.

21. A superconducting quantum interference device according to claim 19; further comprising a feedback-modulation coil magnetically coupled with the superconducting ring and being formed of a thin film superconductive material on the substrate.

22. A superconducting quantum interference device according to claim 19; further comprising a second substrate, and wherein the detecting coil is formed on the second substrate and the two substrates are connected so that a magnetic flux detected by the detecting coil is transmitted to the superconducting ring by the input coil.

23. A superconducting quantum interference device according to claim 19; wherein the superconducting loop comprises the detecting coil and the input coil, each being formed of a superconductive film material having a critical temperature higher than the critical temperature of the superconductive film material forming the Josephson junctions.

24. A non-destructive evaluation apparatus comprising: a sample vessel containing an evacuated inner chamber; a sample support disposed in the chamber for supporting a sample; and a superconducting quantum interference device disposed proximate the sample for inspecting a surface of the sample; wherein the superconducting quantum interference device comprises a superconducting ring containing Josephson junctions formed of a superconductive film material, a feedback-modulation coil magnetically coupled with the superconducting ring, and a detecting coil formed of a superconductive film material having a critical temperature higher than a critical temperature of the superconductive film material forming the Josephson junctions.

25. A non-destructive evaluation apparatus according to claim 24; wherein the superconducting quantum interference device is disposed at an angle of inclination with respect to the sample surface so that a temperature gradient is formed across the superconducting quantum interference device so that a temperature of the sample surface above the critical temperature of the Josephson junctions and below that of the detecting coil does not affect the Josephson junctions.

26. A non-destructive evaluation apparatus according to claim 24; wherein the superconducting quantum interference device further comprises a washer coil coupled with the Josephson junctions.

27. A non-destructive evaluation apparatus according to claim 24; wherein the superconducting quantum interference device further comprises an input coil coupled with the superconducting ring.

28. A non-destructive evaluation apparatus according to claim 27; wherein the input coil of the superconducting quantum interference device is coupled with the detecting coil.

29. A non-destructive evaluation apparatus according to claim 24; wherein the detecting coil of the superconducting quantum interference device comprises a portion of the superconducting ring.

30. A non-destructive evaluation apparatus according to claim 24; wherein the superconducting quantum interference device further comprises superconducting connecting sections formed of a superconductive material for connecting the detecting coil and the superconducting ring.

31. A non-destructive evaluation apparatus according to claim 24; wherein the superconducting quantum interference device further comprises a second substrate, and wherein the detecting coil is formed on the second substrate and the two substrates are pasted together by a superconductive material.

32. A non-destructive evaluation apparatus according to claim 31; wherein the input coil of the superconducting quantum interference device is formed on the second substrate.

* * * * *